United States Patent (10) Patent No.: US 7,419,749 B2
Inazuki et al. (45) Date of Patent: Sep. 2, 2008

(54) HALFTONE PHASE SHIFT MASK BLANK, HALFTONE PHASE SHIFT MASK AND THEIR PREPARATION

(75) Inventors: Yukio Inazuki, Joetsu (JP); Hiroki Yoshikawa, Joetsu (JP); Satoshi Okazaki, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 585 days.

(21) Appl. No.: 11/062,438

(22) Filed: Feb. 23, 2005

(65) Prior Publication Data
US 2005/0186487 A1 Aug. 25, 2005

(30) Foreign Application Priority Data
Feb. 24, 2004 (JP) ............................. 2004-047483

(51) Int. Cl.
*G03F 1/00* (2006.01)
(52) U.S. Cl. .......................................................... 430/5

(58) Field of Classification Search ..................... 430/5, 430/394; 428/428, 430
See application file for complete search history.

(56) References Cited

U.S. PATENT DOCUMENTS 6,783,634 B2 * 8/2004 Nozawa et al. ........... 204/192.1

FOREIGN PATENT DOCUMENTS

JP 7-140635 A 6/1995

* cited by examiner

*Primary Examiner*—Stephen Rosasco
(74) *Attorney, Agent, or Firm*—Birch, Stewart, Kolasch & Birch, LLP

(57) ABSTRACT

In a halftone phase shift mask blank comprising a halftone phase shift film on a substrate which is transparent to exposure light, the halftone phase shift film comprises a metal, silicon, and optionally oxygen and nitrogen. The halftone phase shift film experiences a phase difference change of up to 1 deg. and a transmittance change of up to 0.2% before and after it is exposed to light in a cumulative dose of 1 kJ/cm². The halftone phase shift film has excellent resistance to exposure light, specifically high-energy exposure light of short wavelength such as ArF or $F_2$ laser beam (193 or 157 nm).

12 Claims, 4 Drawing Sheets

FIG.8A
FIG.8B
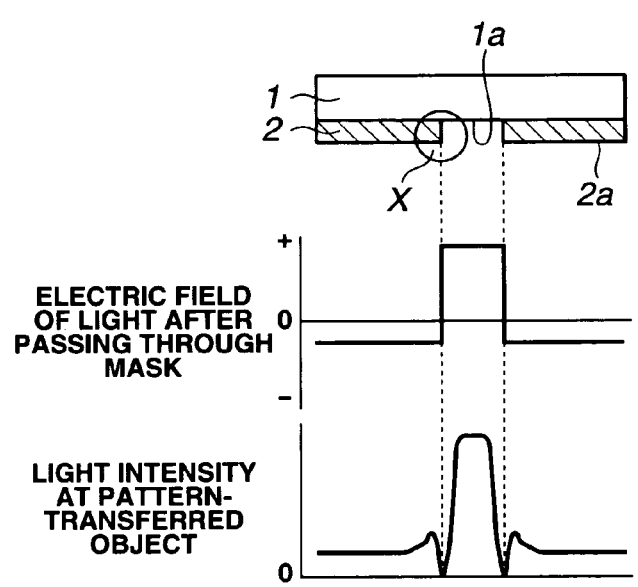
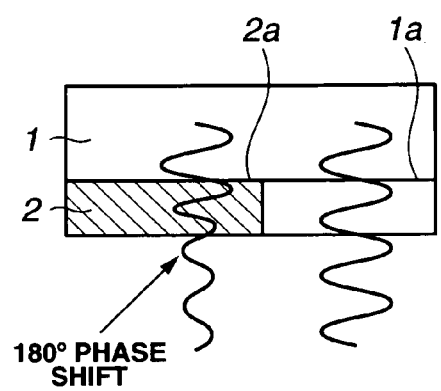

HALFTONE PHASE SHIFT MASK BLANK, HALFTONE PHASE SHIFT MASK AND THEIR PREPARATION

CROSS-REFERENCE TO RELATED APPLICATION

This non-provisional application claims priority under 35 U.S.C. §119(a) on Patent Application No. 2004-047483 filed in Japan on Feb. 24, 2004, the entire contents of which are hereby incorporated by reference.

TECHNICAL FIELD

This invention relates to a phase shift mask blank and phase shift mask for use in the fabrication of semiconductor integrated circuits or the like. More particularly, it relates to a halftone phase shift mask blank and halftone phase shift mask having a phase shifter for attenuating light of exposure wavelength, and methods for preparing the same.

BACKGROUND ART

Photomasks are used in a wide variety of applications including the fabrication of semiconductor integrated circuits such as ICs, LSIs and VLSIs. Basically, the photomask is prepared from a photomask blank having a chromium based light-shielding film on a transparent substrate, by forming a predetermined pattern in the light-shielding film by photolithography using UV or electron beams. The current demand for a higher level of integration in the semiconductor integrated circuit market has created a need for a finer pattern rule. The traditional solution is by reducing the wavelength of exposure light.

However, reducing the wavelength of exposure light improves resolution at the sacrifice of focal depth. This lowers the process stability and adversely affects the manufacture yield of products. One effective pattern transfer method for solving the problem is a phase shift method. A phase shift mask is used as a mask for transferring a micro-pattern.

Referring to FIGS. 8A and 8B, a phase shift mask is illustrated as comprising a substrate 1 and a phase shifter film 2 deposited thereon. The mask consists of a phase shifter 2a that forms a pattern on the substrate and an uncovered area 1a of the substrate 1 that is exposed where the phase shifter 2a is absent. A phase difference of about 180° is set between light transmitted by the uncovered substrate area 1a and light transmitted by the phase shifter 2a. Due to light interference at the pattern boundary, the light intensity at the interfering boundary becomes zero, improving the contrast of a transferred image. The phase shift method permits to increase the focal depth for acquiring the desired resolution. This achieves improvements in resolution and exposure process margin, as compared with conventional masks having ordinary light-shielding patterns in the form of chromium film.

Depending on the light transmission of phase shifter, the phase shift masks are generally divided for practical application into full transmission type phase shift masks and halftone type phase shift masks. The full transmission type phase shift masks are transparent to the exposure light wavelength because the light transmittance of the phase shifter section is equal to the light transmittance of uncovered substrate areas. In the halftone type phase shift masks, the light transmittance of the phase shifter section is several percents to several tens of percents of the light transmittance of uncovered substrate areas.

Referring to the drawings, there is illustrated the basic structure of a halftone type phase shift mask blank and a halftone type phase shift mask. The halftone type phase shift mask blank shown in FIG. 1 has a halftone phase shift film 2 formed over substantially the entire surface of a substrate 1. Patterning the phase shift film 2 results in the halftone type phase shift mask which is shown in FIG. 6 as comprising phase shifter sections 2a forming the pattern on the substrate 1 and uncovered areas 1a of the substrate where the phase shifter is absent. Light that passes the phase shifter section 2a is phase shifted relative to light that passes the uncovered substrate area 1a. The transmittance of the phase shifter section 2a is set to a light intensity that is insensitive to the resist on a wafer or article subject to pattern transfer. Accordingly, the phase shifter section 2a has a light-shielding function of substantially shielding exposure light.

The halftone phase shift masks include single-layer halftone phase shift masks featuring a simple structure and ease of manufacture. Some single-layer halftone phase shift masks known in the art have a phase shifter of MoSi base materials such as MoSiO and MoSiON as described in JP-A 7-140635.

In general, when a pattern is transferred to a resist formed on a wafer, a phase shift mask is repeatedly irradiated with exposure light within a stepper/scanner. During the process, the halftone phase shift film of the phase shift mask can be damaged by the energy of irradiating light. Then repeated irradiation of exposure light gradually leads to some deviations from the initially set phase difference and transmittance. These deviations affect the position and dimensional accuracy of a pattern to be formed on a wafer and eventually, have detrimental effects such as lower yields of device manufacture.

The exposure light irradiated through the phase shift mask has a wavelength which is selected in accordance with the fineness of a pattern to be formed on a wafer. Specifically, exposure light of a shorter wavelength, for example, in the order of 365 nm for i-line, 248 nm for KrF laser, 193 nm for ArF laser, and 157 nm for $F_2$ laser is used as the pattern to be formed on a wafer becomes finer. The wavelength used in pattern exposure becomes shorter, which means that light with a higher level of energy is used as the exposure light. Then, the problem that the halftone phase shift film is damaged by repeated exposure becomes significant.

SUMMARY OF THE INVENTION

An object of the invention is to provide a halftone phase shift mask blank which experiences minimized changes of phase shift and transmittance upon repeated irradiation of exposure light, that is, has excellent resistance to exposure light. Another object is to provide a halftone phase shift mask obtained therefrom, and methods of preparing the blank and the mask.

The present invention addresses a halftone phase shift mask blank comprising a halftone phase shift film on a substrate which is transparent to exposure light. The inventor has discovered that when the halftone phase shift film contains a metal and silicon, and preferably oxygen and nitrogen in addition thereto and also preferably is deposited by sputtering under a gas pressure of up to 0.2 Pa, the halftone phase shift film shows excellent resistance to exposure light, specifically high-energy exposure light of short wavelength such as ArF excimer laser beam (193 nm) or $F_2$ laser beam (157 nm), as demonstrated by a phase difference change of up to 1 deg. and a transmittance change of up to 0.2% before and after it is exposed to light in a cumulative dose of 1 kJ/cm². There is obtained a halftone phase shift mask blank comprising a halftone phase shift film with excellent resistance to exposure light of short wavelength. A halftone phase shift mask obtained from this blank exhibits excellent resistance to exposure light, especially of short wavelength and endures repetitions of exposure which are sufficient from the aspect of productivity during imagewise exposure of wafers or the like.

In one aspect, the invention provides a halftone phase shift mask blank comprising a halftone phase shift film on a substrate which is transparent to exposure light, wherein the halftone phase shift film comprises a metal and silicon, and the halftone phase shift film shows a phase difference change of up to 1 deg. and a transmittance change of up to 0.2% before and after it is exposed to light in a cumulative dose of 1 kJ/cm$^2$.

In one preferred embodiment, the halftone phase shift film further contains oxygen and nitrogen. The metal is preferably composed of two or more elements, more preferably two or more elements selected from among Mo, Zr, Ta and W. Typically, the exposure light is ArF excimer laser or $F_2$ laser light.

In another aspect, the invention provides a method for preparing the halftone phase shift mask blank defined above, comprising the step of depositing the halftone phase shift film on the substrate by sputtering under a gas pressure of up to 0.2 Pa.

In a further aspect, a halftone phase shift mask is obtained by patterning the halftone phase shift film in the halftone phase shift mask blank defined above.

In a still further aspect, the invention provides a method for preparing a halftone phase shift mask, comprising the steps of forming a resist film on the halftone phase shift film in the halftone phase shift mask blank defined above, lithographically processing the resist film to form a patterned resist film, etching away those portions of the halftone phase shift film which are not covered with the patterned resist film, and removing the resist film to form a pattern.

The halftone phase shift mask blank of the present invention has a halftone phase shift film which shows excellent resistance to exposure light, specifically high-energy exposure light of short wavelength such as ArF excimer laser beam (193 nm) or $F_2$ laser beam (157 nm). The halftone phase shift mask prepared therefrom exhibits excellent resistance to exposure light, especially of short wavelength and ensures that a number of exposure steps, which is sufficient from the aspect of productivity, are repeated during imagewise exposure of wafers or the like.

BRIEF DESCRIPTION OF THE DRAWINGS

The above and other features and advantages of the invention will be more fully understood by reading the following description, taken in conjunction with the accompanying drawings.

FIG. 7 illustrates in sectional view the method of manufacturing halftone phase shift masks according to the invention.

FIGS. 8A and 8B illustrate the operating principle of a halftone phase shift mask. FIG. 8B is an enlarged view of region X in FIG. 8A.

DESCRIPTION OF THE PREFERRED EMBODIMENT

According to the present invention, a halftone phase shift mask blank comprising a halftone phase shift film on a substrate which is transparent to exposure light is provided. The halftone phase shift film comprises a metal and silicon. When the halftone phase shift film is irradiated with exposure light in a cumulative dose of 1 kJ/cm$^2$, it shows a phase difference change of up to 1 deg., especially up to 0.5 deg. and a transmittance change of up to 0.2%, especially up to 0.1% before and after the irradiation of exposure light.

Figure 1:
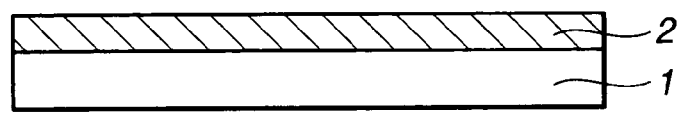
FIG. 1 is a sectional view showing a halftone phase shift mask blank in one embodiment of the invention.

Referring to FIG. 1, the halftone phase shift mask blank of the invention is illustrated as comprising a transparent substrate 1 which is transparent to exposure light and made of quartz, $CaF_2$ or the like and one layer of halftone phase shift film 2 deposited thereon. In another embodiment, the halftone phase shift film 2 consists of two or more layers of different compositions.

In the halftone phase shift mask blank of the invention, the halftone phase shift film contains a metal and silicon, preferably a metal, silicon and at least one element selected from oxygen, nitrogen and carbon, and more preferably a metal, silicon, oxygen and nitrogen.

The metal may be any single element selected from transition metals and lanthanoids, preferably two or more elements selected from transition metals and lanthanoids, and more preferably two elements. Suitable transition metals include Mo, Zr, Ta, and W. The more preferred metal is a combination of Mo and Zr, a combination of Mo and Ta, or a combination of Zr and Ta.

Preferably, the halftone phase shift mask blank of the invention exhibits a phase difference which has a substrate in-plane distribution within ±2.0 degrees and a transmittance which has a substrate in-plane distribution within ±0.15%. It is noted that the phase difference, also referred to as phase shift, is a difference in phase between the incident exposure light and the light transmitted by the halftone phase shift film; and the substrate in-plane refers to various positions where exposure light is transmitted. Also preferably, the halftone phase shift film has an in-plane center value of phase difference of 180°±10° and an in-plane center value of transmittance of several percents to several tens of percents, especially 3 to 40%.

In one embodiment of the halftone phase shift mask blank wherein the halftone phase shift film is composed of molybdenum, zirconium, silicon, oxygen and nitrogen, its composition may be 0.1-20.0 at %, especially 0.5-10.0 at % of Mo; 0.1-10.0 at %, especially 0.2-5.0 at % of Zr; 20.0-70.0 at %, especially 30.0-60.0 at % of Si; 2.0-60.0 at %, especially 10.0-50.0 at % of O; and 2.0-60.0 at %, especially 10.0-50.0 at % of N.

The halftone phase shift film has a thickness of typically about 40 to 150 nm, especially about 60 to 100 nm, although the thickness varies with the film composition, the wavelength of exposure light, transmittance, and the like.

The halftone phase shift mask blank of the invention may be prepared by sputtering, specifically by placing a substrate and a target or targets in a chamber, feeding a sputtering gas or gases to the chamber, and applying a power to the target to create a discharge for thereby depositing a halftone phase shift film on the substrate. The sputtering gas used is typically an inert gas such as neon, argon or krypton, optionally in admixture with at least one reactive gas which is selected from oxygen-containing gases, nitrogen-containing gases and carbon-containing gases, in accordance with the desired type of light elements including oxygen, nitrogen and carbon, of which the halftone phase shift film is constructed.

The target used herein contains a metal (corresponding to the metal contained in the halftone phase shift film to be formed) and/or silicon. When the metal in the phase shift film is a single metal element, a phase shift film containing a single metal element and silicon may be formed using both a metal target and a silicon target, or both a metal silicide target and a silicon target, or a metal silicide target alone.

When the metal in the phase shift film is a mixture of two or more metal elements, a phase shift film containing two or more metal elements and silicon may be formed using a combination of two or more metal targets and a silicon target, a combination of a target of a mixture of two or more metal elements (alloy target) and a silicon target, a target of a mixture of two or more metal elements and silicon alone, a combination of a target of a mixture of two or more metal elements and silicon and a silicon target, or a combination of two or more metal silicide targets of different metal species. The target used herein may contain a light element or elements in addition to the metal or metals and silicon.

When only an inert gas is used as the sputtering gas, a halftone phase shift film consisting of a metal and silicon can be formed. It is preferred to use a reactive gas along with the inert gas. When a reactive gas is used, the sputtering is reactive sputtering.

The oxygen-containing gas includes $CO_2$, NO, $O_2$, etc.; the nitrogen-containing gas includes NO, $NO_2$, $N_2$, etc.; and the carbon-containing gas includes $CH_4$, $CO_2$, CO, etc. A proper choice may be made among these gases in accordance with the desired composition of light elements of which the halftone phase shift film is constructed.

Figure 2:
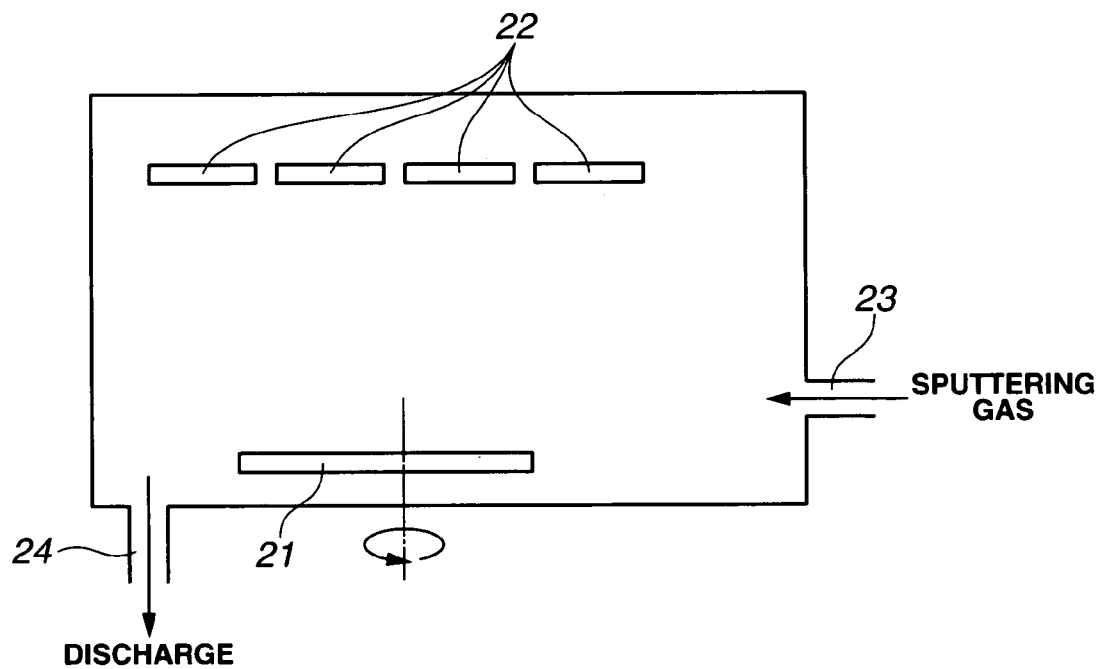
FIG. 2 schematically illustrates a typical sputtering system suited for the manufacture of a halftone phase shift mask blank according to the invention.

The sputtering system used herein may be DC sputtering, magnetron sputtering or the like. It is preferred that the transparent substrate be rotated about its axis perpendicular to its surface (to receive a deposit) faced toward the targets during the sputtering process. FIG. 2 illustrates one preferred sputtering system which includes a sputtering chamber where a substrate 21 and targets 22 are disposed. The chamber has an inlet 23 for the sputtering gas and an outlet 24.

In a preferred embodiment of the method of preparing a halftone phase shift mask blank according to the invention, the halftone phase shift film is deposited by sputtering under a low gas pressure.

The gas pressure during deposition may be lowered either by reducing the flow rate of sputtering gas to be fed during deposition or by increasing the discharge rate from the sputtering chamber. The procedure of reducing the flow rate of sputtering gas is convenient. The flow rate of the gas to be fed during the sputtering is reduced so that a halftone phase shift film being deposited may have desired values of optical properties and composition. A careful adjustment is necessary in setting the gas pressure because even a slight lowering of pressure results in variations of optical properties (i.e., phase difference and transmittance) of a halftone phase shift film being deposited. The flow rates of gases are adjusted under a reduced gas pressure state so as to provide the film with the desired optical properties.

The gas pressure is preferably 0.2 Pa or lower, and more preferably 0.15 Pa or lower. A lower gas pressure leads to a film having higher resistance to exposure light and hence, less changes of optical properties before and after irradiation of exposure light. However, the electric discharge may become unstable under an extremely low gas pressure. A gas pressure of at least 0.04 Pa is thus preferred.

The optical properties of the halftone phase shift film also depend on the type and composition of elements of which the film is constructed, the type and flow rate of gases used during deposition. The halftone phase shift film can be formed as a film of two or more layers when the depositing conditions are properly altered to tailor optical properties.

For example, when it is desired to increase the transmittance of a film containing a metal and silicon, a higher transmittance to exposure light may be obtained by increasing the ratio of silicon to metal in the film. The means for increasing the ratio of silicon to metal in the film include altering the composition of a target when a target of a mixture of metal and silicon is used and increasing the power applied to a silicon-rich target when a plurality of targets of different compositions are used. By either of these means, the silicon content in the film can be increased.

It is also possible to adjust the transmittance of a film by increasing the content of oxygen and/or nitrogen in the film. The means for increasing the content of oxygen include increasing the amount of oxygen-containing gas fed to the sputtering chamber. The means for increasing the content of nitrogen include increasing the amount of nitrogen-containing gas fed to the sputtering chamber. By such means, the oxygen and/or nitrogen content in the film can be adjusted.

Figure 3:
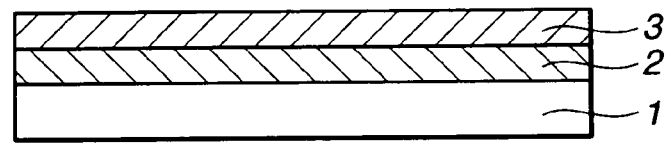
FIG. 3 is a sectional view of a halftone phase shift mask blank having a chromium-based light-shielding film.
Figure 4:
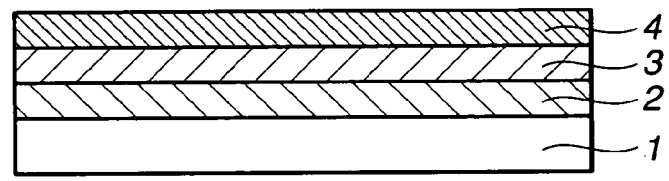
FIG. 4 is a sectional view of a halftone phase shift mask blank having a chromium-based light-shielding film and a chromium-based antireflection film.
Figure 5:
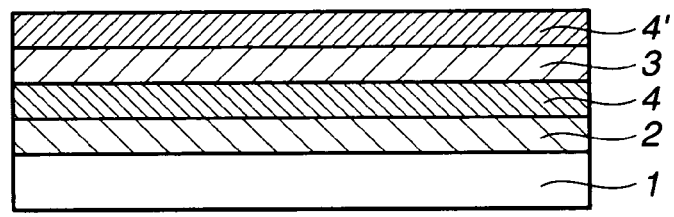
FIG. 5 is a sectional view of a halftone phase shift mask blank having a chromium-based light-shielding film and chromium-based antireflection films.

In preferred embodiments of the invention, a chromium based light-shielding film or a chromium based antireflective film or both are formed on the halftone phase shift film. In one preferred embodiment, as shown in FIG. 3, the phase shift mask blank further includes a chromium-based light-shielding film 3 on the halftone phase shift film 2. In a further preferred embodiment, as shown in FIG. 4, the phase shift mask blank further includes a chromium-based antireflection film 4 formed on the chromium-based light-shielding film 3 for reducing reflection from the light-shielding film 3. In a still further preferred embodiment, as shown in FIG. 5, the phase shift mask blank includes a halftone phase shift film 2, a first chromium-based antireflection film 4, a chromium-based light-shielding film 3, and a second chromium-based antireflection film 4' formed on a transparent substrate 1 in the described order.

The chromium-based light-shielding film or chromium-based antireflection film is preferably made of chromium oxycarbide (CrOC), chromium oxynitride carbide (CrONC) or a multilayer combination of both.

The chromium-based light-shielding film or chromium-based antireflection film can be formed by reactive sputtering. Specifically, the target is neat chromium or chromium having added thereto oxygen, nitrogen, carbon or a combination thereof. The sputtering gas is an inert gas such as argon or krypton in admixture with a reactive gas.

Since the halftone phase shift mask blank of the invention has good resistance to irradiation of short wavelength exposure light, a halftone phase shift mask prepared therefrom is an effective halftone phase shift mask having a transmittance of at least 15% and suited for exposure to ArF or $F_2$ laser light.

Therefor, the blank is best suited for a halftone phase shift mask having a transmittance of at least 15% and intended for ArF or $F_2$ laser exposure.

Figure 6:
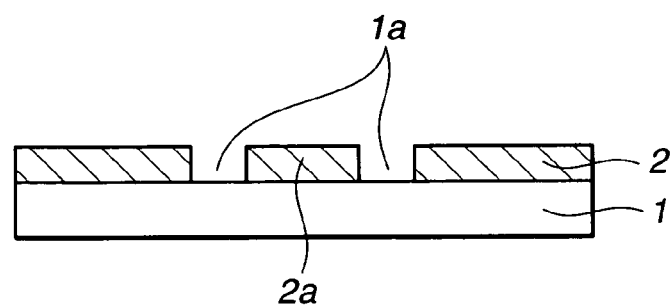
FIG. 6 is a sectional view of a halftone phase shift mask in one embodiment of the invention.
Figure 7A:
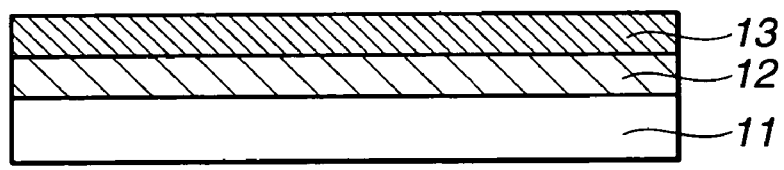
FIG. 7A shows the mask blank on which a resist film has been formed.
Figure 7B:
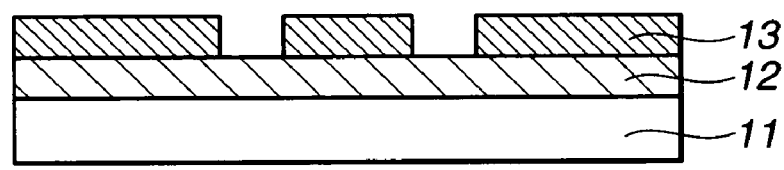
FIG. 7B shows the structure after the resist film has been patterned.
Figure 7C:
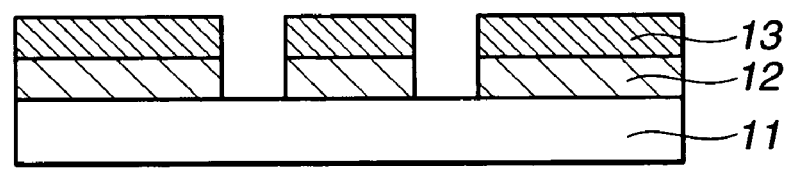
FIG. 7C shows the structure after etching.
Figure 7D:
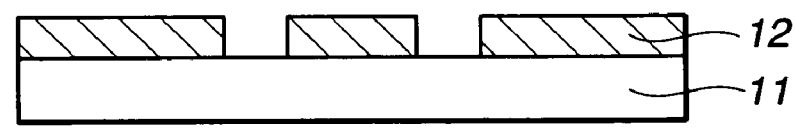
FIG. 7D shows the structure after the resist film has been removed.

The halftone phase shift mask of the invention is manufactured by patterning the phase shift film on the halftone phase shift mask blank. More specifically, by patterning the halftone phase shift film 2 on the halftone phase shift mask blank shown in FIG. 1, a halftone phase shift mask as shown in FIG. 6 is manufactured. The halftone phase shift mask includes patterned phase shifter sections 2a and uncovered substrate areas 1a therebetween.

The halftone phase shift mask of the structure shown in FIG. 6 may be manufactured by a process as shown in FIG. 7. After a halftone phase shift film 12 is formed on a substrate 11 by the process described above, a resist film 13 is formed on the film 12 (FIG. 7A). The resist film 13 is lithographically patterned (FIG. 7B), after which the phase shift film 12 is etched (FIG. 7C), and the resist film 13 is subsequently stripped (FIG. 7D). In this process, application of the resist film, patterning (exposure and development), etching, and removal of the resist film may be carried out by known methods.

In cases where a Cr-based film (e.g., chromium-based light-shielding film and/or chromium-based antireflection film) is formed on the halftone phase shift film, a halftone phase shift mask on which the Cr-based film (chromium-based light-shielding film) remains at the peripheral edges of the substrate can be produced by etching away the Cr-based film in the regions that are to be subject to light exposure, thereby leaving the surface of the phase shift film exposed, then patterning the phase shift film into sections as described above. Alternatively, a halftone phase shift mask can be produced by applying a resist to the Cr-based film and patterning the resist, then etching the Cr-based film and the phase shift film for patterning. Only the regions of the Cr-based film that are to be subject to light exposure are then removed by selective etching so as to leave the phase shift pattern exposed at the surface.

EXAMPLE

Examples and Comparative Examples are given below for illustrating the invention although the invention is not limited thereto.

Example 1

A sputtering system included a cathode structure having a plurality of targets and a supporting/rotating mechanism for rotating a substrate about its axis. The targets disposed in the chamber included two molybdenum silicide ($MoSi_{3.66}$) targets, one Zr target, and three Si targets. The sputtering gases included Ar, $N_2$ and $N_2O$. The substrate was a quartz substrate of 152 mm square. While rotating the substrate, DC sputtering was carried out to deposit a halftone phase shift film of MoZrSiON having a thickness of 93.0 nm on the substrate, yielding a halftone phase shift mask blank. The depositing conditions were set as shown in Table 1.

TABLE 1

| Target input power | $MoSi_{3.66}$ | 50 W |
|---|---|---|
| | Zr | 15 W |
| | Si | 280 W |
| Flow rate of sputtering gas | Ar | 5 sccm |
| | $N_2$ | 20 sccm |
| | $N_2O$ | 2.0 sccm |
| Gas pressure | | 0.13 Pa |

The phase shift film as deposited was measured for phase shift and transmittance at wavelength 193 nm over its region of 142 mm×142 mm, excluding peripheral edges. It had a center value of phase shift of 185.9 deg. and a center value of transmittance of 9.58%. It also had a phase shift distribution of ±0.6° and a transmittance distribution of ±0.2%. It is noted that the phase shift and transmittance were measured using an analyzer MPM-193 by Laser Tec Co., Ltd. (the same holds true in the following Examples). The composition of the phase shift film was analyzed to be 2.7% Mo, 2.0% Zr, 38.2% Si, 39.0% O, and 18.1% N.

Next the halftone phase shift mask blank having a halftone phase shift film deposited as above was repeatedly irradiated with exposure light, i.e., ArF laser light of wavelength 193 nm at an energy density of 2.5 mJ/$cm^2$·Pulse until the exposure dose cumulated to 5 kJ/$cm^2$. The phase shift film was again measured for phase shift and transmittance at wavelength 193 nm over its region of 142 mm×142 mm, excluding peripheral edges. As compared with the values prior to the cumulative irradiation, it showed a phase shift change of −1.0 deg. and a transmittance change of +0.1%.

Example 2

A sputtering system included a cathode structure having a plurality of targets and a supporting/rotating mechanism for rotating a substrate about its axis. The targets disposed in the chamber included two molybdenum silicide ($MoSi_{3.66}$) targets, one Zr target, and three Si targets. The sputtering gases included Ar, $N_2$ and $N_2O$. The substrate was a quartz substrate of 152 mm square. While rotating the substrate, DC sputtering was carried out to deposit a halftone phase shift film of MoZrSiON having a thickness of 95.0 nm on the substrate, yielding a halftone phase shift mask blank. The depositing conditions were set as shown in Table 2.

TABLE 2

| Target input power | $MoSi_{3.66}$ | 50 W |
|---|---|---|
| | Zr | 15 W |
| | Si | 280 W |
| Flow rate of sputtering gas | Ar | 5 sccm |
| | $N_2$ | 20 sccm |
| | $N_2O$ | 6.5 sccm |
| Gas pressure | | 0.14 Pa |

The phase shift film as deposited was measured for phase shift and transmittance at wavelength 193 nm over its region of 142 mm×142 mm, excluding peripheral edges. It had a center value of phase shift of 175.2 deg. and a center value of transmittance of 17.46%. It also had a phase shift distribution of ±0.5° and a transmittance distribution of ±0.12%. The composition of the phase shift film was analyzed to be 2% Mo, 2% Zr, 36% Si, 45% O, and 14% N.

Next the halftone phase shift mask blank having a halftone phase shift film deposited as above was repeatedly irradiated with exposure light, i.e., ArF laser light of wavelength 193 nm at an energy density of 2.5 mJ/$cm^2$·Pulse until the exposure dose cumulated to 5 kJ/$cm^2$. The phase shift film was again measured for phase shift and transmittance at wavelength 193 nm over its region of 142 mm×142 mm, excluding peripheral edges. As compared with the values prior to the cumulative irradiation, it showed a phase shift change of −1.0 deg. and a transmittance change of +0.2%.

COMPARATIVE EXAMPLE 1

A sputtering system included a cathode structure having a plurality of targets and a supporting/rotating mechanism for rotating a substrate about its axis. The targets disposed in the chamber included two molybdenum silicide ($MoSi_{3.66}$) targets, one Zr target, and three Si targets. The sputtering gases included Ar, $N_2$ and $N_2O$. The substrate was a quartz substrate of 152 mm square. While rotating the substrate, DC sputtering was carried out to deposit a halftone phase shift film of MoZrSiON having a thickness of 90.9 nm on the substrate, yielding a halftone phase shift mask blank. The depositing conditions were adjusted as shown in Table 3.

TABLE 3

| Target input power | $MoSi_{3.66}$ | 50 W |
|---|---|---|
|  | Zr | 15 W |
|  | Si | 280 W |
| Flow rate of sputtering gas | Ar | 5 sccm |
|  | $N_2$ | 100 sccm |
|  | $N_2O$ | 2.0 sccm |
| Gas pressure |  | 0.49 Pa |

The phase shift film as deposited was measured for phase shift and transmittance at wavelength 193 nm over its region of 142 mm×142 mm, excluding peripheral edges. It had a center value of phase shift of 174.4 deg. and a center value of transmittance of 19.27%. It also had a phase shift distribution of ±0.8° and a transmittance distribution of ±0.20%. The composition of the phase shift film was analyzed to be 3% Mo, 2% Zr, 38% Si, 36% O, and 21% N.

Next the halftone phase shift mask blank having a halftone phase shift film deposited as above was repeatedly irradiated with exposure light, i.e., ArF laser light of wavelength 193 nm at an energy density of 2.5 $mJ/cm^2$·Pulse until the exposure dose cumulated to 0.9 $kJ/cm^2$. The phase shift film was again measured for phase shift and transmittance at wavelength 193 nm over its region of 142 mm×142 mm, excluding peripheral edges. As compared with the values prior to the cumulative irradiation, it showed a phase shift change of −1.5 deg. and a transmittance change of +0.5%.

A comparison is made between Example 1 and Comparative Example 1. Comparative Example 1 marked a phase difference change of 1.5 deg. and a transmittance change of 0.5% before the cumulative exposure dose reached 1 $kJ/cm^2$. In contrast, Example 1 marked a phase difference change of 1.0 deg. and a transmittance change of 0.1% even after laser light was irradiated to a cumulative exposure dose of 5 $kJ/cm^2$. The halftone phase shift mask blank of Example 1 had greater resistance to exposure light than that of Comparative Example 1 by a factor of at least 7.5 for phase difference and at least 25 for transmittance. The gas pressure was 0.13 Pa in Example 1 and 0.49 Pa in Comparative Example 1, indicating that the resistance to exposure light is improved by setting a lower gas pressure during film deposition.

In Example 2 wherein a halftone phase shift film was deposited by increasing the flow rate of $N_2O$ gas serving as an oxygen source so that the film might have a transmittance approximate to that of Comparative Example 1, the halftone phase shift mask blank had greater resistance to exposure light than that of Comparative Example 1 by a factor of at least 7.5 for phase difference and at least 12.5 for transmittance.

Japanese Patent Application No. 2004-047483 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift mask blank comprising a halftone phase shift film on a substrate which is transparent to exposure light,
said halftone phase shift film comprising a metal and silicon, said halftone phase shift film showing a phase difference change of up to 1 deg. and a transmittance change of up to 0.2% before and after it is exposed to light in a cumulative dose of 1 $kJ/cm^2$, wherein
said metal comprises two or more elements.

2. The halftone phase shift mask blank of claim 1, wherein said halftone phase shift film further contains oxygen and nitrogen.

3. The halftone phase shift mask blank of claim 1, wherein said metal comprises two or more elements selected from among Mo, Zr, Ta and W.

4. The halftone phase shift mask blank of claim 3, wherein said metal is a combination of Mo and Zr, a combination of Mo and Ta, or a combination of Zr and Ta.

5. The halftone phase shift mask blank of claim 4, wherein said halftone phase shift film further contains oxygen and nitrogen.

6. The halftone phase shift mask blank of claim 3, wherein said metal is a combination of Mo and Zr.

7. The halftone phase shift mask blank of claim 6, wherein said halftone phase shift film further contains oxygen and nitrogen.

8. The halftone phase shift mask blank of claim 7, wherein the halftone phase shift film comprises: 0.1-20.0 at % of Mo; 0.1-10.0 at % of Zr; 20.0-70.0 at % of Si; 2.0-60.0 at% of O; and 2.0-60.0 at% of N.

9. The halftone phase shift mask blank of claim 1, wherein the exposure light is ArF excimer laser or $F_2$ laser light.

10. A method for preparing the halftone phase shift mask blank of claim 1, comprising the step of depositing the halftone phase shift film on the substrate by sputtering under a gas pressure of up to 0.2 Pa.

11. A halftone phase shift mask obtained by patterning the halftone phase shift film in the halftone phase shift mask blank of claim 1.

12. A method for preparing a halftone phase shift mask, comprising
forming a resist film on the halftone phase shift film in the halftone phase shift mask blank of claim 1,
lithographically processing the resist film to form a patterned resist film,
etching away those portions of the halftone phase shift film which are not covered with the patterned resist film, and
removing the resist film to form a pattern.

* * * * *